United States Patent [19]

Frech et al.

[11] Patent Number: 6,043,724
[45] Date of Patent: Mar. 28, 2000

[54] TWO-STAGE POWER NOISE FILTER WITH ON AND OFF CHIP CAPACITORS

[75] Inventors: Roland Frech, Ostfildern; Erich Klink, Schoenaich, both of Germany; William F. Shutler, Wappingers Falls, N.Y.; Ulrich Weiss, Holzgerlingen; Thomas-Michael Winkel, Schoenaich, both of Germany

[73] Assignee: International Business Machines Corporation, Armonk, N.Y.

[21] Appl. No.: 09/015,231

[22] Filed: Jan. 29, 1998

[30] Foreign Application Priority Data

Dec. 4, 1997 [EP] European Pat. Off. .............. 97121289

[51] Int. Cl.[7] ...................................... H03H 7/06
[52] U.S. Cl. .............................. 333/181; 333/172; 331/17
[58] Field of Search .................................... 333/172, 181, 333/185, 12; 331/17; 257/532, 533; 361/763, 764

[56] References Cited

U.S. PATENT DOCUMENTS

| | | | |
|---|---|---|---|
| 3,287,657 | 11/1966 | Widl | 331/17 |
| 5,031,233 | 7/1991 | Ragan | 455/307 |
| 5,061,904 | 10/1991 | Mantopoulis et al. | 331/17 X |
| 5,191,301 | 3/1993 | Mullgrav, Jr. | 331/75 X |
| 5,239,448 | 8/1993 | Perkins et al. | 361/764 |
| 5,488,540 | 1/1996 | Hatta | 333/181 X |
| 5,504,459 | 4/1996 | Gersbach et al. | 331/17 |
| 5,604,466 | 2/1997 | Dreps et al. | 331/113 R |
| 5,854,575 | 12/1998 | Fiedler et al. | 331/17 X |

FOREIGN PATENT DOCUMENTS 410 164  1/1991  European Pat. Off. ............... 257/532

OTHER PUBLICATIONS

Baumgartner, S.J., et al., Noise–Insensitive Biasing for Filter to VCO Interface, IBM Technical Disclosure Bulletin, vol. 34, No. 11, Apr., 1992.

*Primary Examiner*—Robert Pascal
*Assistant Examiner*—Justin P. Bettendorf
*Attorney, Agent, or Firm*—Lily Neff; William B. Porter

[57] ABSTRACT

Described is a novel implementation of a medium and high frequency on-module (off-chip)/on-chip power noise filter for power noise sensitive circuits. To achieve this, a second order low-pass approach is used. The first stage capacitor is located on-module (off-chip), and the second stage capacitor is implemented on-chip.

5 Claims, 2 Drawing Sheets

6,043,724

TWO-STAGE POWER NOISE FILTER WITH ON AND OFF CHIP CAPACITORS

FIELD OF INVENTION

The present invention relates in general to an apparatus and a method designed to reduce mid and high frequency power noise. More particularly, this invention relates to reduction of mid and high frequency power noise using sensitive circuits, such as voltage controlled oscillators (VCO) and phase locked loops (PLL).

BACKGROUND OF THE INVENTION

The growing complexity of modern devices, especially in CMOS circuits, is the reason for the increased usage of simultaneously switching logic and I/O circuits on the chips which in turn have contributed to an increase in mid and high frequency power noise. In order to increase or save system performance, many efforts have been made in the past to protect sensitive circuits, such as PLLS, from being exposed to any power noise.

Phase locked loops, herein after PLLs, are sensitive to all noise, especially to mid and high frequency power noise. Such noise exposure can result in an output jitter which impacts the cycle time and the overall system performance. In the past, efforts to reduce the power noise, had included the placement of many different capacitors (of mixed types) on modules and on boards.

Voltage controlled oscillators, hereinafter VCOs, are the most power noise sensitive circuit in the PLL circuit. The state of the art VCO power filter designs use either off-chip filter capacitors or on-chip (integrated) capacitors for stabilizing voltage.

Due to design efforts, assembly costs and area consumption on modules and boards using the off-chip filter implementation is very expensive. This solution is also less effective due to the high parasitics elements of the and the path (R,L) intrinsic on the device. Furthermore, the off-chip filter implementation is limits its application since the parasitic elements prevent the high speed current transfer from the off-chip capacitor to the chip level.

On-chip VCOs are usually implemented using a multivibrator circuit where the oscillation is controlled by charging and discharging of an on-chip capacitor. A common application for such a circuit is in an optical high speed data link, which usually houses a serializer VCO and a deserializer VCO on the same module. These VCOs are especially sensitive to power supply noises, other VCOs and data patterns which have the same frequency component as the VCO operating frequency, but are asynchronous with each other. The type of noise in such circuits is usually referred to as near frequency noise. Sufficient amount of near frequency noise can override the control voltage input to the VCO and cause the PLL, (which houses the VCO ), to lose the phase lock. Any noise which contains odd harmonic frequencies (of the fundamental wave) will also affect the VCO although the sensitivity is not as dominant as the fundamental wave frequency itself.

The on-chip implementation is also limited due to low on-chip capacitance values.

IBM TDB, Vol. 34, No. 11, April 1992, p. 351–352 discloses an interface circuit that converts a differential input voltage to two equal bias currents which can be used to drive a VCO. The circuit is inherently high in noise rejection due to the differential circuitry used. Noise rejection is also improved by introducing noise roll-off capacitors in the interface biasing. The low capacitance requires only on-chip (integrated) capacitors.

In U.S. Pat. No. 5,191,301 there is disclosed a highly stable, high frequency VCO for phase locked loops, which VCO is adapted to be fully integrated on a single silicon chip and is operable over a wide frequency range without using off-chip capacitors.

U.S. Pat. No. 5,504,459 describes a filter network for a PLL circuit having a VCO with a control input and a bias input. The filter network includes a first filter circuit and a second filter circuit. The first filter circuit provides both a "pole" and a "zero" to the transfer function of the PLL. The second filter circuit is coupled between the control input and the bias input to the VCO.

An on-chip voltage controlled oscillator for use in an analog phase locked loop is described in U.S. Pat. No. 5,604,466. The VCO receives power from a voltage regulator which greatly reduces the noise seen by the VCO. The voltage regulator includes a passive filter coupled to the regulated power supply for attenuating high frequency noise from the regulated power supply, and for supplying power from the power supply to the voltage regulator, whereby the passive filter comprises a first resistor-capacitor pair for attenuating noise frequencies higher than a first threshold, and a second resistor-capacitor pair for attenuating noise frequencies higher than a second threshold.

However, the above-mentioned solutions have certain disadvantages. For example, due to parasitics, the above-mentioned solutions all have a limited electrical efficiency. The fact that, according to the above mentioned proposals, it is desirable to integrate all of the components of the VCO into a single silicon chip results in large area consumption on the module and/or board. Furthermore, placing a mix of different capacitor types in high quantities on the module and/or board leads to high component costs resulting from the need for complex assembly process leading to high assembly costs.

SUMMARY OF THE INVENTION

An object of the present invention is to provide a power noise filter for noise sensitive circuits that reduce power noise without suffering from the disadvantages inherent in the state of the art solutions thereby allowing faster system operation.

A further object of the invention to provide such a filter where all parasitic elements are part of the filter design and the effectiveness of the filter is optimized.

The optimized power noise filter according to the invention uses on-chip capacitors, on-chip resistors and on-module (off-chip) capacitors including on- and off-chip power line inductances. The power supply input of the VCO is connected through a special low pass filter circuit to the system power supply. The design minimizes all off-chip parasitic elements (R and L) and optimizes all on-chip connections. The on-module vias and controlled collapse chip contacts (C4) are also contained in the design.

In order to efficiently dampen the mid and high frequency power noise (wherein mid frequency means frequencies in the range from 10 to 100 MHz and high frequency means frequencies greater than 100 MHz), a second order low-pass approach is used. The first stage capacitor is located on-module (off-chip), and the second stage capacitor is implemented on-chip. Two on-chip resistors are optimized and the parasitics of the on-module connections of the on-module capacitor to the chips C4s are minimized to maximize filter efficiency.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

The power noise filter of the present invention can be used with all kinds of noise sensitive circuits. In a preferred embodiment such as the one described below, the present invention is used in conjunction with a high precision VCO to reduce power noise induced PLL jitter. However, the use of the present invention, is in no way limited to the use of VCO's or PLL's and any such limitation is only provided in way of example.

Figure 1:
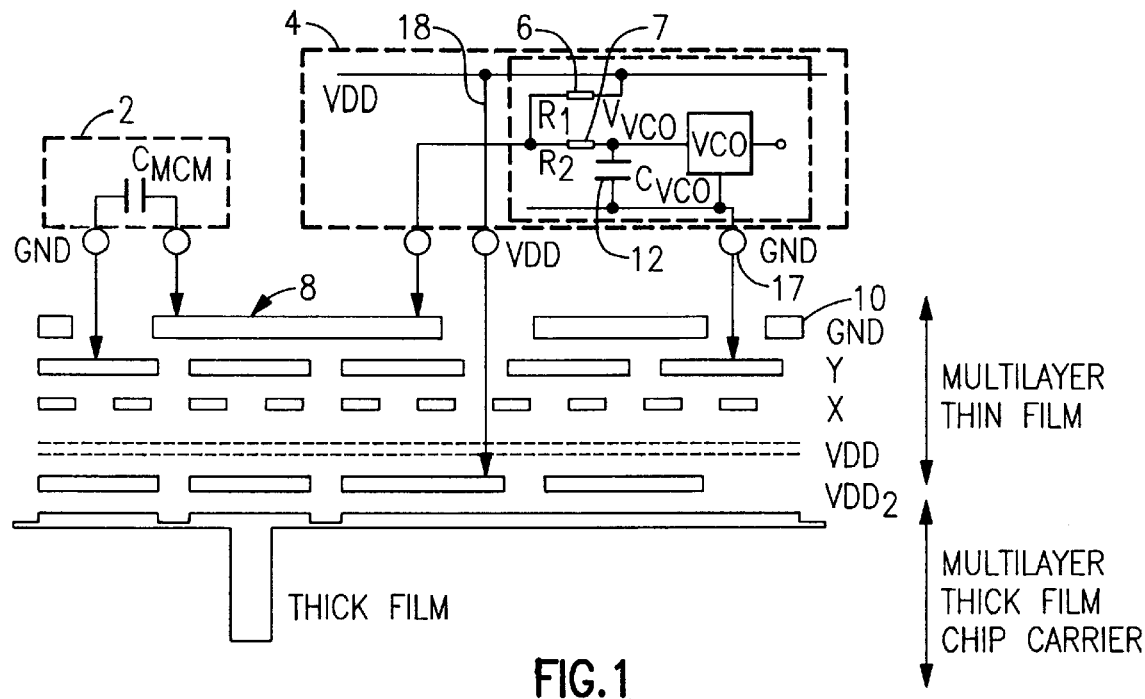
FIG. 1 is a schematic layout of a VCO with the filter according to one embodiment of the present invention.
Figure 2:
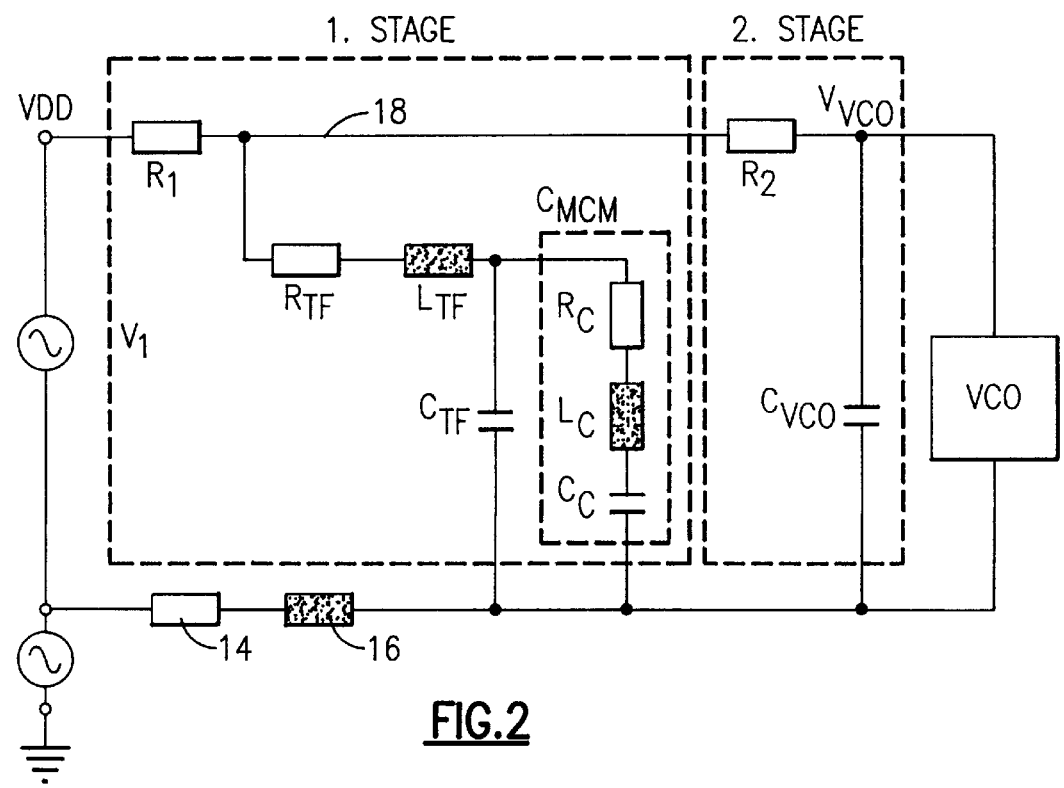
FIG. 2 depicts the equivalent circuit model of the 2-stage filter according to one embodiment of the present invention.

FIG. 1 shows the schematic layout of the VCO in combination with the on-chip/on-module (off-chip) power noise filter according to one embodiment of the present invention. The first stage of the power noise filter consists of an on-module (off-chip) capacitor shown at 2 (such as $C_{MCM}$), the on-chip resistance $R_1$ shown at 6, connecting the voltage plane (on-chip) VDD to the chip internal node VDD shown at 18, and a thin film wire $R_{TF}$ shown at 8 in the uppermost layer of a multi layer thin film (repair/pad metal). The chip itself as shown at 4, is connected to the top surface metal layer 10 of a multilayer thin film, e.g., by C4s 17 (this technique being known as "flip chip technology"). The thin film structure is placed on top of a multilayer thick film chip carrier. The purpose of the first stage mechanism is to reduce the mid frequency power noise. This first stage mechanism provides a low inductive charge backup (high speed) for the second stage mechanism capacitance ($C_{VCO}$). The purpose of the second stage mechanism is to reduce the high frequency power noise. This second stage mechanism provides a very low inductive current source for the power noise sensitive circuits, e.g., the VCO. The corresponding equivalent circuit model of the first stage mechanism is shown in FIG. 2.

In order to meet the requirements of accurate mid and high frequency power noise simulations, the wiring model of the thin film is given by $R_{TF}$, $L_{TF}$ and $C_{IF}$ (not only RC-model), whereby $R_{TF}$ is the line resistance, $L_{TF}$ is the line inductance and $C_{TF}$ is the line capacitance of the thin film wire 8 in the top surface metal layer 10.

Due to the following reasons the usage of this metal layer is especially advantageous:

Low loop inductance due to thin dielectric between layer 10 and GND meshplane,

Low ohmic connection due to thicker layer 10,

Via parasitics within the thin film are negligible,

Appropriate line widths without interference with x-y-wiring.

Alternatively, the connections between the off-chip capacitor and the chip can also be provided through x-y-signal layers. In this case the efficiency of the damping is reduced due to higher resistance and higher inductance.

In an alternate embodiment a layer $VDD_2$ can be used as a connection between capacitor 2 and chip 4 (cf. FIG. 1). However, in this case a higher loop inductance results.

The complete equivalent circuit model includes the parasitic effects of the C4s. The electrical behavior of the on-module (off-chip) capacitor 2 is given by $R_c$, $L_c$ and $C_c$. The effectivity of the first stage depends on the electrical connection of $R_1$ and the capacitor 2. Therefore, as already stated above, the thin film wiring has to be low resistive and low inductive. These requirements can easily be met by optimizing, i.e., minimizing the dimensions of $R_{TF}$, e.g., in the repair metal layer 10.

The second stage mechanism consists of the on-chip resistor $R_2$, 7, and the on-chip capacitance $C_{VCO}$, 12. The purpose of the second stage mechanism is to reduce the high frequency power noise. Compared to $C_{VCO}$ 12, the parasitic capacitances and inductances of the on-chip wiring to the resistors $R_1$, 6 and $R_2$, 7 can be neglected (cf. FIG. 1).

The electric values of the ground plane are represented by the ground resistance $R_{GND}$ 14 and the ground inductance $L_{GND}$ 16.

To demonstrate the efficiency of the 2-stage on-chip/on-module filter for mid and high frequency power noise, two noise sources $V_1$ and $V_2$ (cf. FIG. 2) were connected to VDD voltage and to the ground plane. $V_1$ is defined with 100 mV power collapse and in addition for the $V_2$ 50 mV ground bounce were assumed. Two different slopes are used for the noise sources to reflect mid and high frequency characteristics.

Figure 3:
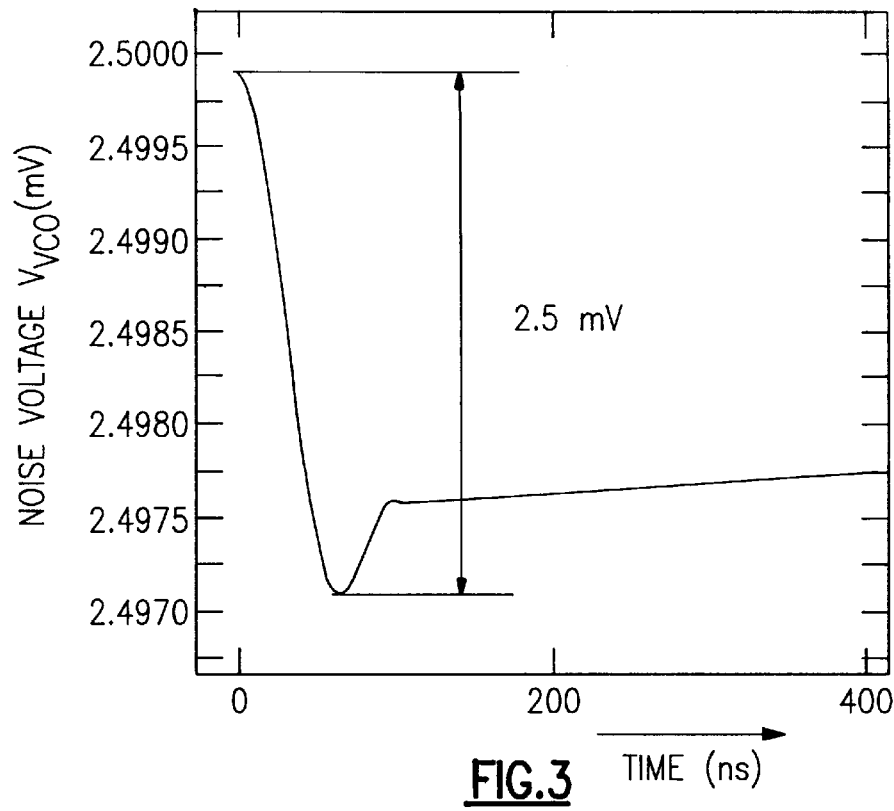
FIG. 3 is a graph illustrating mid frequency noise voltage at the VCO according to the workings of the present invention.
Figure 4:
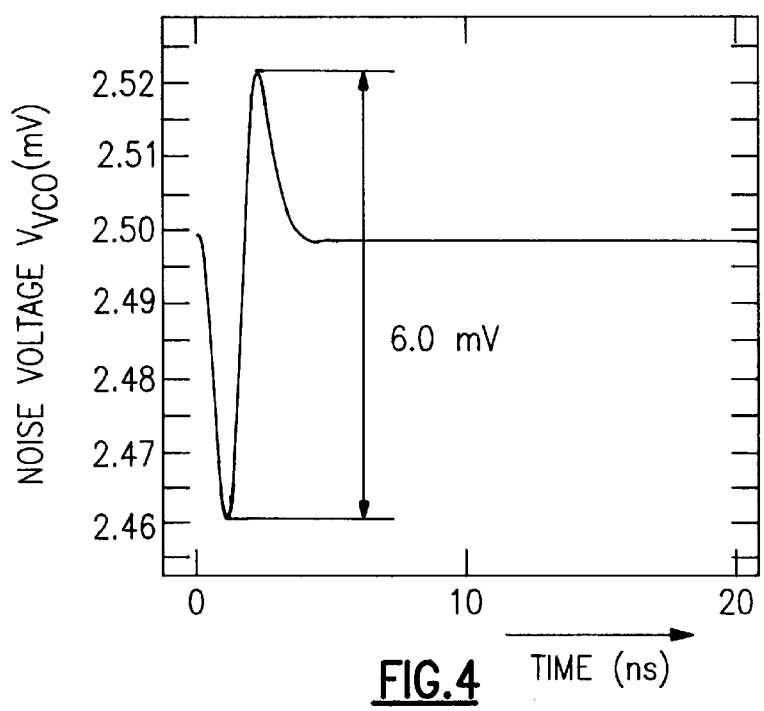
FIG. 4 is another graph showing the high frequency noise voltage at the VCO according to the workings of the present invention.

The simulation results shown in FIGS. 3 and 4 show the filtered internal VCO voltage node $V_{VCO}$ in a mid and high frequency range, respectively.

Table 1 below compares the power noise results at the voltage node $V_{VCO}$ of the first stage on-chip filter approach and the optimized two stage on-chip/on-module filter of the present invention.

TABLE 1

Comparison of Noise Voltage at VCO Circuit

| Noise Voltage at internal VCO voltage node $V_{VCO}$ | 2-stage on-chip/on-module filter | 1-stage on-chip filter |
|---|---|---|
| $V_{VCO}$ mid frequency | 2.5 mV | 140 mV |
| $V_{VCO}$ high frequency | 6.0 mV | 21 mV |

The values in Table 1 show that, due to the optimized 2-stage filter according to the present invention, the mid frequency power noise is reduced from 150 mV to 2.5 mV and the high frequency power noise from 150 mV to 6.0 mV. The values of the single stage on-chip filter are 140 mV and 21 mV, respectively. Hence, the optimized 2-stage filter according to the invention reduces the mid frequency power noise by 137 mV and the high frequency power noise by 15 mV as compared to the single stage on-chip filter.

Assuming VCO power noise sensitivities of 2 ps/mV for high frequency sensitivity, and 4 ps/mv for mid frequency sensitivity, the 2-stage optimized on-module (off-chip)/on-chip filter reduces the power noise induced PLL jitter by 334 ps (274 ps (−MF)+60 ps (−HF)) as compared to state of the art on-chip filters. The minimum system cycle time is directly improved by this value. For a system cycle of 3 ns, this cycle time reduction improvement means 11%.

Assuming an actual high frequency power noise of 600 mV, the system performance improvement, using the 2-stage optimized on-module (off-chip)/on-chip filter of the present invention is even 17–20%, which means also 17–20% more MIPS.

In the above-described 2-stage on-chip/on-module (off-chip) filter for the VCO circuit, a filter design with a mix of concentrated on-chip and on-module (off-chip) elements is provided whereby a significant power noise reduction at the VCO can be achieved. The present application introduces a design which reduces the PLL jitter, in a preferred embodiment by as much as 300–500 ps, and improves the system performance as well as the cycle times by about 17–20%. This is achieved with a reduced number of on-module (off-chip)/on board decoupling capacitors and therefore, at the same time, reduces the costs of on-board capacitor components and assembly.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An optimized power noise filter for providing a stabilized supply to a multi-chip, multi-module voltage controlled device, said filter comprising:

a power supply input line of said controlled device connected through a special low pass filter circuit to a power supply, said special low pass filter circuit comprising a first stage off-chip capacitor and a second stage on-chip capacitor;

said first stage off-chip capacitor configured to filter mid-level frequency noises;

said second stage on-chip capacitor configured to filter high frequency power noises;

at least two on-chip resistors optimized to correct parasitic effects of on-module connections;

means for conncting said off-chip capacitor to a chip having said second stage on-chip capacitor in a manner as to maximize filter efficiency so as to also dampen said mid and high frequency power noises.

2. The filter of claim 1, wherein said first off-chip capacitance and said chip are connected to one another by means of a thin film wire.

3. The filter of claim 2, wherein said thin film wire is located in the uppermost layer of a multilayer thin film structure.

4. The filter of claim 1, wherein said off-chip capacitance and said chip are connected by means of x-y-signal layers.

5. The filter of claim 1, wherein said off-chip capacitance and said chip are connected to one another by means of a layer representing all other possible voltage planes in the thin film.

* * * * *